(12) United States Patent
Egger et al.

(10) Patent No.: US 7,045,837 B2
(45) Date of Patent: May 16, 2006

(54) HARDMASK WITH HIGH SELECTIVITY FOR IR BARRIERS FOR FERROELECTRIC CAPACITOR MANUFACTURING

(75) Inventors: Ulrich Egger, Kanagawa-ken (JP); Haoren Zhuang, Tokyo-to (JP); Yoshinoru Kumura, Tokyo (JP); Kazuhiro Tomioka, Tokyo (JP); Hiroyuki Kanaya, Kanagawa-ken (JP)

(73) Assignees: Infineon Technologies AG (DE); Kabushiki Kaisha Toshiba (JP)

( * ) Notice: Subject to any disclaimer, the term of this patent is extended or adjusted under 35 U.S.C. 154(b) by 216 days.

(21) Appl. No.: 10/356,314

(22) Filed: Jan. 31, 2003

(65) Prior Publication Data

US 2004/0150923 A1 Aug. 5, 2004

(51) Int. Cl.
*H01L 29/76* (2006.01)

(52) U.S. Cl. ............... 257/295; 257/288; 257/213; 438/3

(58) Field of Classification Search ........ 257/213, 257/288, 295, E21.208, E21.436, E21.663, 257/E21.664, E27.104, E29.164, E29.272; 438/3
See application file for complete search history.

(56) References Cited

U.S. PATENT DOCUMENTS

| | | | | |
|---|---|---|---|---|
| 5,773,314 A | * | 6/1998 | Jiang et al. | 438/3 |
| 6,485,988 B1 | * | 11/2002 | Ma et al. | 438/3 |
| 6,495,413 B1 | | 12/2002 | Sun et al. | |
| 6,611,014 B1 | | 8/2003 | Kanaya et al. | |
| 2001/0022372 A1 | | 9/2001 | Kanaya et al. | |
| 2001/0034106 A1 | | 10/2001 | Moise et al. | |
| 2002/0074588 A1 | * | 6/2002 | Lee | 257/306 |
| 2003/0124791 A1 | * | 7/2003 | Summerfelt et al. | 438/238 |

FOREIGN PATENT DOCUMENTS

JP 2001036026 2/2001

OTHER PUBLICATIONS

International Search Report, Mailing date Jul. 26, 2004.

* cited by examiner

*Primary Examiner*—Nathan J. Flynn
*Assistant Examiner*—Scott Wilson
(74) *Attorney, Agent, or Firm*—Lerner, David, Littenberg Krumholz & Mentlik, LLP

(57) ABSTRACT

The present invention provides a ferroelectric device relatively free of fences by using a hardmask having high etching selectivity relative to an underlying barrier layer. The present invention also includes a method for suppressing the fences clinging to the sidewalls of ferroelectric devices. Additionally, the present invention provides a ferroelectric device having a hardmask relatively thin compared to an underlying barrier layer when compared to prior art devices.

19 Claims, 5 Drawing Sheets

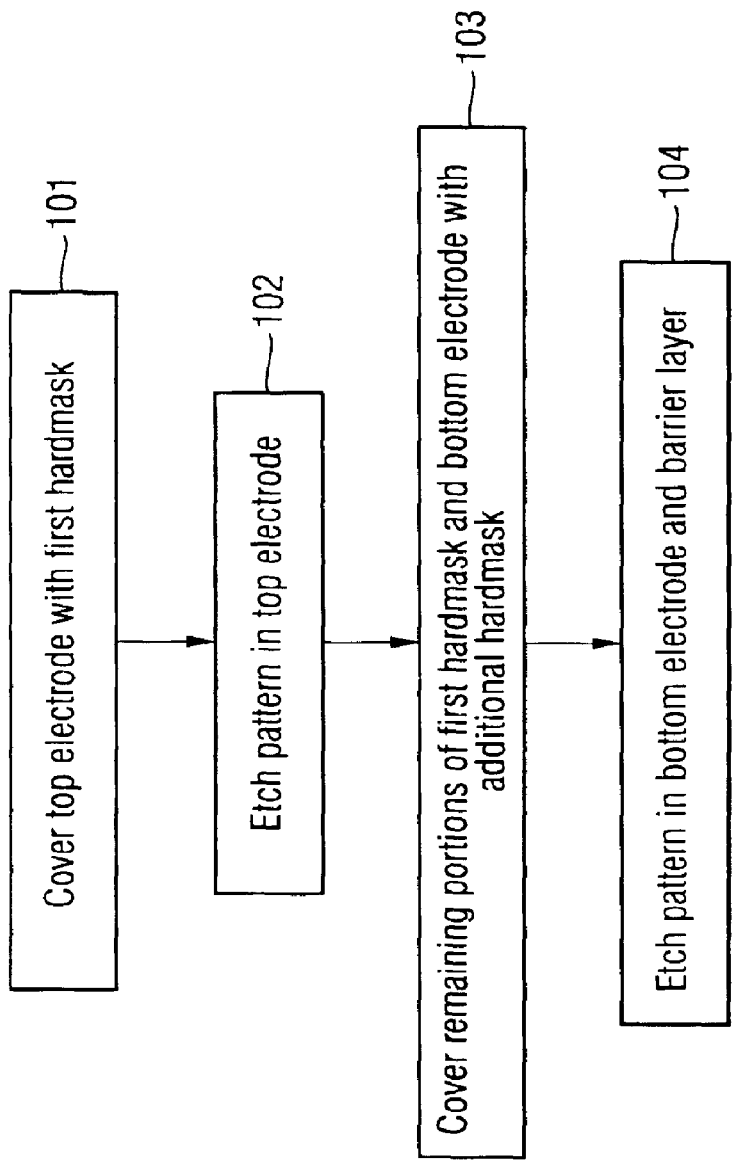

HARDMASK WITH HIGH SELECTIVITY FOR IR BARRIERS FOR FERROELECTRIC CAPACITOR MANUFACTURING

FIELD OF THE INVENTION

The present invention relates to hardmasks used for etching barrier layers incorporated in ferroelectric devices.

BACKGROUND OF THE INVENTION

In prior-art wafers, poly silicon plugs (contact plugs) are often used as vertical interconnects between metal lines in multilevel interconnect schemes. The ferroelectric materials in FeRAM (Ferroelectric Random Access Memory) and high K materials in DRAM generally are crystallized at a high temperature (600C or above) in oxygen ambient. A thick barrier against oxygen diffusion is needed to prevent the diffusion of oxygen from a ferroelectric capacitor to the contact plug. An Ir (Iridium) based barrier is a good material to efficiently block this oxygen diffusion. A typical hardmask used during the etching of this Ir barrier is made from TEOS (Tetraethyl Orthosilicate). Due to the low etching selectivity between Ir and TEOS, the thickness of the barrier is limited by the maximum usable hardmask thickness and the TEOS hardmask needs to be very thick compared to the capacitor stack, resulting in a steep side wall angle prior to etching.

FIGS. 1–3 show conventional hardmask etching steps for ferroelectric capacitors.

FIG. 1 shows a wafer 1 following prior art processing steps. Following deposition of a ferroelectric stack, a top electrode (TE) 6 is covered with a TEOS hardmask 2 and mask resist strip patterning of the top electrode 6 is performed using halogen or CO-based chemistry to etch materials such as Iridium, Platinum, Iridium Oxide or various conductive oxide films. A portion of an underlying ferroelectric layer 8 (for example, PZT, SBT, or BLT) might also be etched during this step. A ferroelectric (FE) capacitor 5 is formed from portions including the top electrode 6, ferroelectric layer 8 and a bottom electrode (BE) 3 as shown in the magnified view in the figure.

A Ti glue-layer 7 serves to adhere the bottom electrode 3 to the substructure of the FE capacitor 5. The substructure includes a top TEOS layer 15 covering a top nitride layer 9. Between the Ti glue-layer 7 and the bottom electrode 3 can be layers 17 of Ir (Iridium), $IrO_2$ (Iridium Oxide) or other materials for blocking oxygen diffusion. A poly silicon contact plug 13 passes through the wafer 1 to form an electrical connection between an active region and the bottom electrode 3.

Another TEOS hardmask 4 is deposited in preparation for a second etching step which patterns the bottom electrode 3. During the second etching step, the ferroelectric layer 8 may be further etched along with the bottom electrode 3. There is a slight over-etch through the top TEOS layer 15 along with any intermediate materials such as the layers of Ir (Iridium) and $IrO_2$ (Iridium Oxide). FIG. 2 shows the wafer 1 following this conventional patterning of the bottom electrode 3.

FIG. 3(a) shows the thick hardmask 4 having steeply angled sidewalls 19 which is required due to the low selectivity between the ir of the barrier layer 17 and the TEOS of the hardmask 4. It is desirable to have a thick Ir layer for blocking oxygen diffusion from the ferroelectric layer 8 to the poly silicon contact plug 13, but this is not easily done because it requires a very thick hardmask 4 with the resulting steeply angled sidewalls 19.

FIG. 3(b) shows the wafer of FIG. 3(a) after sputtered controlled etching of the bottom electrode 3 and barrier 17 while using the hardmask 4 for patterning the bottom electrode 3. Due to the steeply angled hardmask sidewalls 19, residues of the etching process or fences 21 remain clinging to the hardmask sidewalls 19. These fences 21 are composed of compounds from the etched materials. They have low density and are unstable. During the anneals, they exhibit volume changes and they show poor adhesion to the side walls. These fences 21 are particularly detrimental to the following encapsulation processes.

One way to avoid these fences 21 would be to use etching gasses which form exclusively volatile compounds. But these are often ruled out due to conflicting requirements, like capacitor damage or undercut of underlying layers. Thus, the etching inevitably proceeds, at least partially, in the sputter controlled regime.

It would be desirable to have a hardmask having a high etching selectivity relative to the barrier layer. In particular, it would be desirable to have a hardmask having a high etching selectivity relative to an Ir-based barrier layer.

SUMMARY OF THE INVENTION

The present invention provides a ferroelectric device relatively free of fences by using a hardmask having high etching selectivity relative to an underlying barrier layer. The present invention also includes a method for suppressing the fences clinging to the sidewalls of ferroelectric devices.

In general terms, the invention is a wafer formed from a barrier layer for blocking the diffusion of contaminants from an intermediate layer. The wafer is also formed with a hardmask having an etching selectivity relative to the barrier layer at least five times the etching selectivity of Ir relative to TEOS. The hardmask protects the intermediate layer while etching of the barrier layer is performed.

More specifically, the wafer of the present invention is a ferroelectric capacitor having a ferroelectric layer between a top and a bottom electrode. A contact plug passes through a substructure of the ferroelectric capacitor and electrically connects the bottom electrode to an active layer. A barrier layer including Iridium in its composition separates the bottom electrode from the substructure and contact plug for inhibiting the diffusion of oxygen from the ferroelectric layer to the contact plug. A first hardmask covers the top electrode to protect portions of the fop electrode during a first etching step patterning the top electrode. An additional hardmask including $Al_2O_3$ in its composition is deposited over remaining portions of the first hardmask and on the bottom electrode for pattern etching of the bottom electrode and the barrier layer.

The present invention also includes a method for manufacturing a ferroelectric capacitor comprising the steps of forming a substructure of the capacitor having a contact plug passing therethrough for electrically connecting a bottom electrode of the capacitor to an underlying active layer; depositing over the substructure the bottom electrode including a barrier layer intermediate therebetween having a composition including Iridium; depositing over the bottom electrode a ferroelectric layer such that the diffusion of oxygen from the ferroelectric layer to the contact plug is inhibited by the intermediate barrier layer, depositing over the ferroelectric layer a top electrode; depositing over the top electrode, the underlying ferroelectric layer and the bottom electrode a first hardmask; etching to pattern the top electrode using the first hardmask; depositing over the remaining portions of the first hardmask and on the bottom electrode an additional hardmask comprised of $Al_2O_3$; and sputter etching to pattern the bottom electrode and the barrier layer such that the sputter effect removes substantially all fences from sidewalls of the additional hardmask.

BRIEF DESCRIPTION OF THE FIGURES

Further preferred features of the invention will now be described for the sake of example only with reference to the following figures, in which:

FIG. 5 shows the processing steps of the present invention.

DETAILED DESCRIPTION OF THE EMBODIMENTS

Figure 4B:
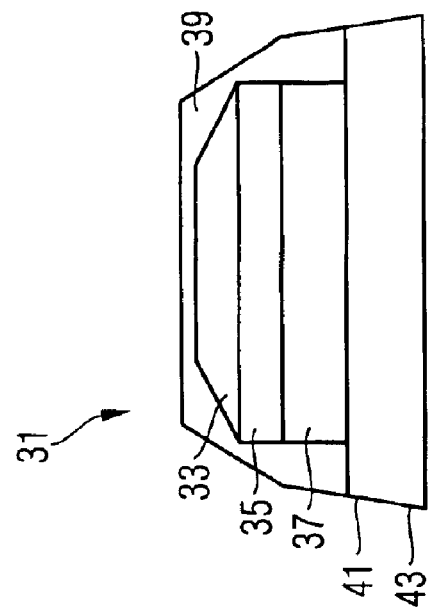
FIG. 4(b) shows the wafer of FIG. 4(a) following etching of the bottom electrode and barrier layer.
Figure 4A:
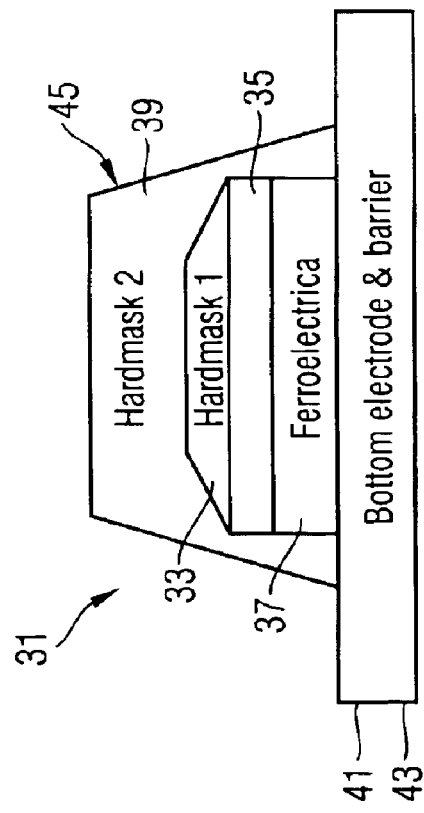
FIG. 4(a) shows a wafer of the present invention using a thin hardmask having high etching selectivity relative to the barrier layer prior to patterning of the bottom electrode.

FIGS. 4(a) and 4(b) show various layers of a wafer 31 during the processing steps of the present invention. FIG. 5 shows the processing steps of the present invention.

A first hardmask 33 is deposited upon a top electrode 35 as illustrated by step 101 in FIG. 5. The top electrode 35 is then patterned in an etching step 102 in FIG. 5. The hardmask 33 can be TEOS, $Al_2O_3$, or other suitable mask materials. This etching step can also be used to etch an underlying ferroelectric layer 37. Alternatively, the ferroelectric layer 37 might only be partially etched at this stage or might separately etched using another etching step.

As illustrated in FIG. 4(a) and at step 103 of FIG. 5, a second hardmask 39 having sidewalls 45 is deposited over remaining portions of the first hardmask 33 and on a bottom electrode 41 in preparation for an additional etching step for patterning the bottom electrode 41 and an underlying barrier layer 43. The underlying barrier layer 43 provides a barrier against oxygen diffusion from the ferroelectric layer 37 forming the ferroelectric capacitor to the contact plug (not shown). During the additional etching step, illustrated at step 105 of FIG. 5, the bottom electrode 41 and barrier layer 43 are patterned.

Any remaining portions of the ferroelectric layer 37 along with any other intermediate layers may also be etched at this step along with the bottom electrode 41 and the barrier layer 43. There can also be a slight over-etch through underlying layers if needed.

Figure 1:
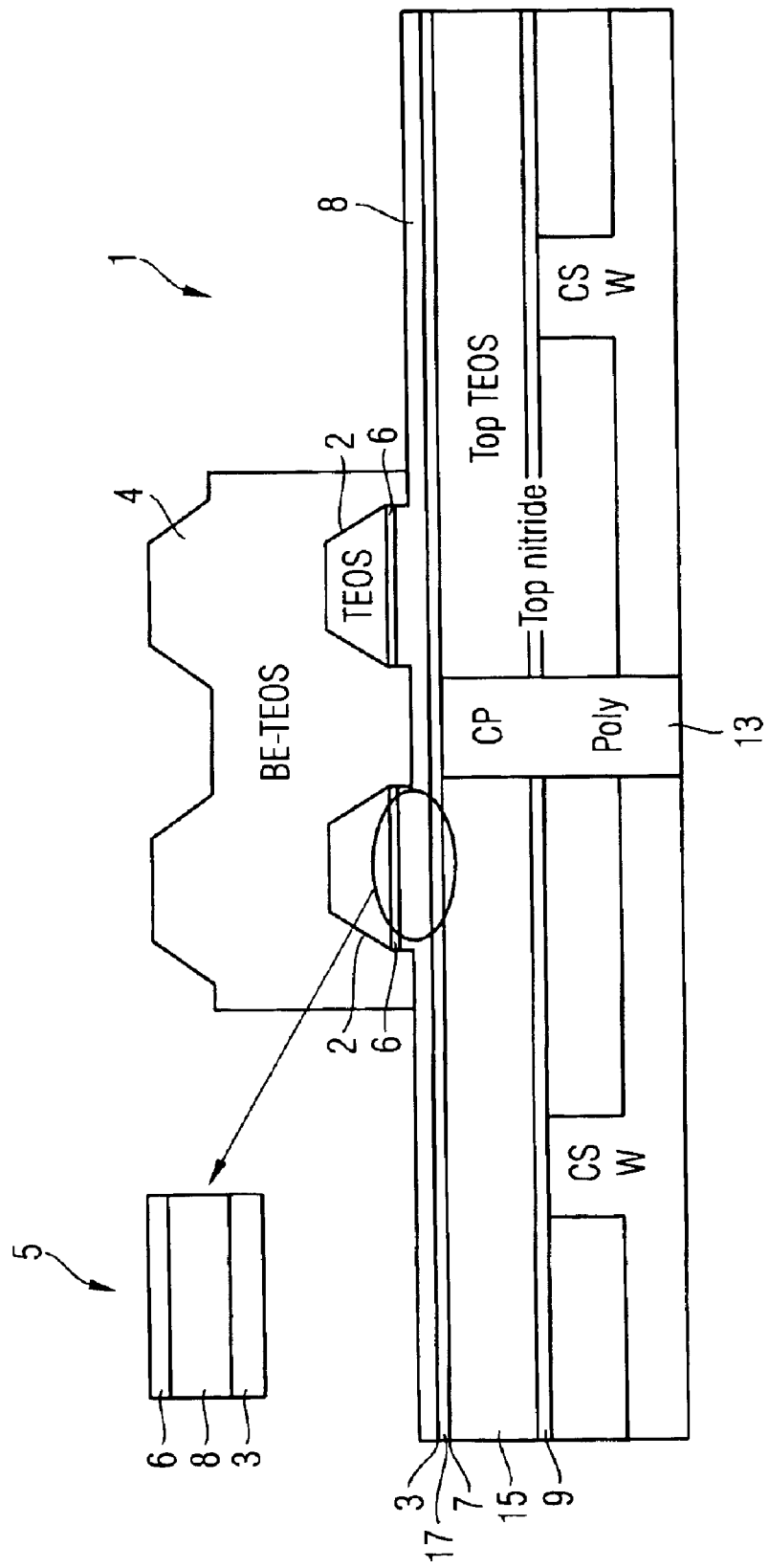
FIG. 1 shows a wafer 1 following prior art processing steps.
Figure 2:
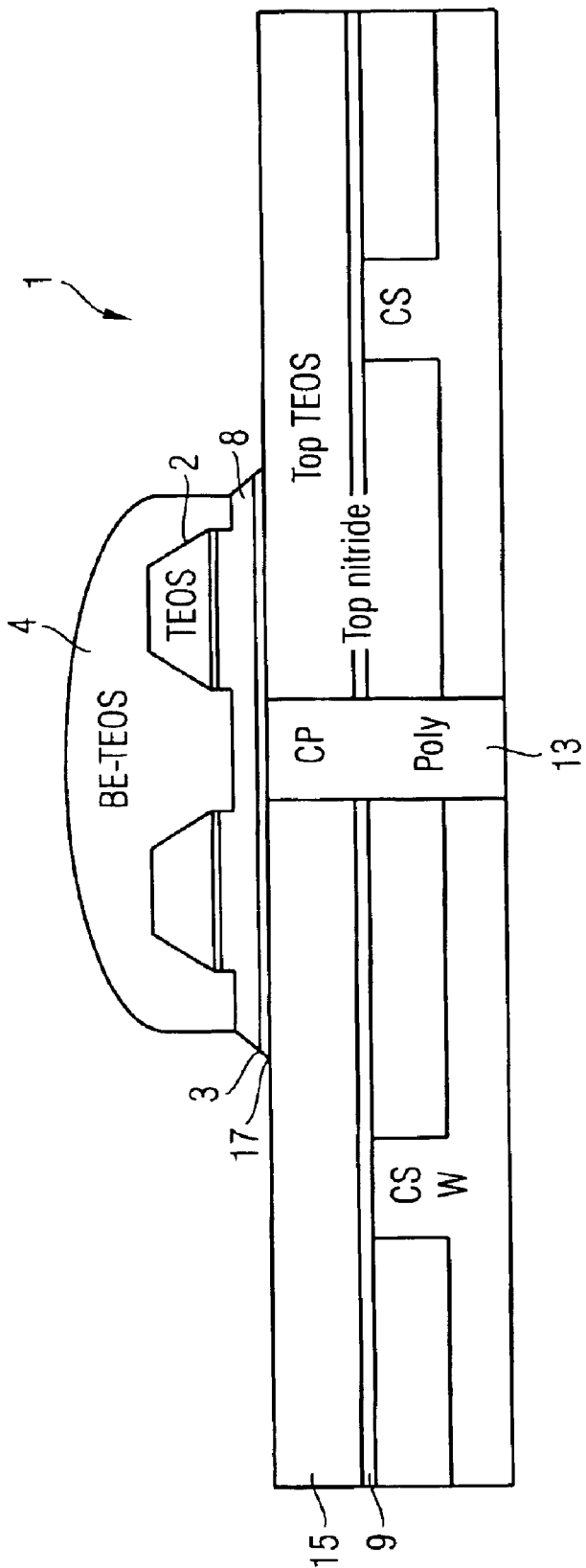
FIG. 2 shows the wafer 1 following conventional patterning of the bottom electrode and barrier layer.
Figure 3B:
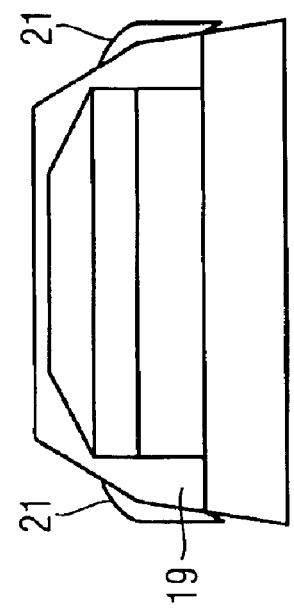
FIG. 3(b) shows the prior-art wafer of FIG. 3(a) after sputtered controlled etching of the bottom electrode and barrier and further illustrates fences clinging to the sidewalls of the hardmask.
Figure 3A:
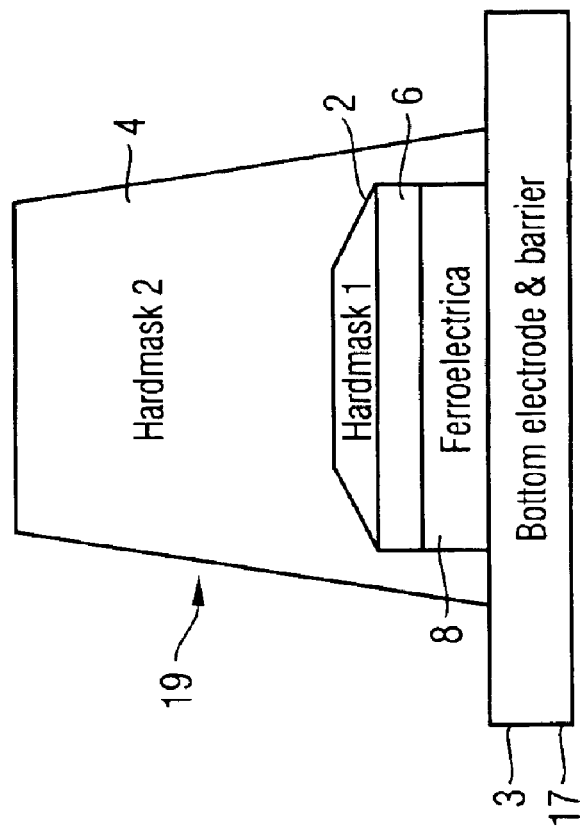
FIG. 3(a) shows a prior-art thick hardmask having steeply angled sidewalls which are required due to the low selectivity between the Ir of the barrier layer and the TEOS of the hardmask.

The present invention uses materials for the barrier layer 43 and hardmask 39 having greater etching selectivity than the prior art. In a preferred embodiment, the barrier layer 43 includes a material such as Ir, just as in the prior art barrier layer 17 illustrated in FIG. 3. However, while the prior art uses a TEOS hardmask 4 (also illustrated in FIG. 3), the present invention utilizes an $Al_2O_3$ hardmask 39 (FIG. 4). The selectivity between Ir and $Al_2O_3$ is more than five times higher than the selectivity between Ir and TEOS. Thus, as illustrated by comparing the hardmasks of FIGS. 3(a) and 4(a), the $Al_2O_3$ hardmask 39 of the present invention can be much thinner than the TEOS hardmask 4 of the prior art. The result is that the sidewalls 45 can have a much lower taper angle than the prior-art sidewalls 19.

FIG. 4(b) shows the wafer following the additional CO-based chemistry sputtered controlled etching step 104 of the bottom electrode 41 and barrier layer 43 while using the hardmask 45 for patterning the bottom electrode 41. Due to the lower taper angle of the hardmask sidewalls 45 (FIG. 4(a)) compared to the hardmask sidewalls 19 (FIG. 3(a)), fences 21 are removed from the hardmask sidewalls 45 due to the sputter effect. The sputter effect is more forceful for the lower taper angle sidewalls than for the more steeply angled sidewalls. Even if the taper angle after the barrier etching step 105 is the same for the TEOS hardmask 4 and the $Al_2O_3$ hardmask 39, the taper angle of the $Al_2O_3$ hardmask 39 is lower at any given time during the etching itself allowing more effective fence prevention as well as removal.

The thinner hardmask 45 has the additional benefit of making it easier to achieve design targets. The resulting FeRAM cell or other device can be reduced in size compared to the prior art because it can have a thick barrier layer 43 without the need for extra space to support a thick hardmask 45. Barrier layers can typically be between 100–200 nm thick. However, using the present invention, unlike the prior art, thickness of 200 nm or above are achievable. The invention also can be used to produce higher quality FeRAM cells due to the thicker barrier layer 43 for better protection against the diffusion of oxygen.

The use of an $Al_2O_3$ hardmask 39 rather than the TEOS hardmask 4 of the prior art leads to additional advantages. It provides additional sealing of the capacitor to protect the ferroelectric layer 37 from hydrogen ions and electrons to reduce degradation of ferroelectric performance. Also, using $Al_2O_3$ rather than TEOS means that there is one less TEOS region contributing to hydrogen damage of the ferroelectric layer 37. Also, the additional $Al_2O_3$ hardmask 39 provides extra protection of the top electrode 35 during subsequent CW-contact etches.

Other materials can be used for either the barrier layer 43 or the hardmask 39 (for example, the hardmask could be TiN or TiAlN used with barriers formed from Ir or $IrO_2$) so long as they have a high etching selectivity between them. For example, the materials should have an etching selectivity of at least five times the etching selectivity between Ir and TEOS when etched using halogen or CO-based chemistry.

The present invention for reducing fences on side-walls by using high to relative etching rate materials to reduce the side-wall taper is widely applicable to various devices and is not limited to FeRAM, ferroelectric and high k devices.

Still other materials and method steps can be added or substituted for those above. Thus, although the invention has been described above using particular embodiments, many variations are possible within the scope of the claims, as will be clear to a skilled reader.

We claim:

1. A ferroelectric capacitor comprising:
a ferroelectric layer between a top and a bottom electrode;
a contact plug passing through a substructure of the ferroelectric capacitor and electrically connecting the bottom electrode to an active layer;

a barrier layer including Iridium in its composition separating the bottom electrode from the substructure and contact plug for inhibiting the diffusion of oxygen from the ferroelectric layer to the contact plug;

a first hardmask covering the top electrode for protecting portions of the top electrode during a first etching step for patterning the top electrode; and an additional hardmask including $Al_2O_3$ in its composition deposited over remaining portions of the first hardmask and on the bottom electrode for pattern etching of the bottom electrode and the barrier layer.

2. The capacitor of claim 1, wherein the $Al_2O_3$ hardmask has an etching selectivity relative to the barrier layer at least five times the etching selectivity of TEOS relative to the same barrier layer.

3. A device comprising:

a barrier layer for blocking the diffusion of contaminants from an intermediate layer; and a hardmask having an etching selectivity relative to the barrier layer at least five times the etching selectivity of Ir relative to TEOS, the hardmask protecting the intermediate layer while etching the barrier layer.

4. The device of claim 3, wherein the material composing the barrier layer includes Ir and the material composing the hardmask includes $Al_2O_3$.

5. The device of claim 3, wherein the material composing the barrier layer includes $IrO_2$ and the material composing the hardmask includes $Al_2O_3$.

6. The device of claim 3, wherein the contaminants include oxygen.

7. The device of claim 3, wherein the intermediate layer includes a top electrode, bottom electrode and ferroelectric layer between the top electrode and bottom electrode to form a ferroelectric capacitor.

8. The device of claim 7, further comprising a contact plug for electrically connecting the bottom electrode to an active region and wherein the barrier layer reduces the amount of oxygen diffusing from the ferroelectric layer to the contact plug.

9. An FeRAM cell using the ferroelectric capacitor of claim 7 for storing data.

10. The device of claim 7, wherein the hardmask seals the capacitor to protect the ferroelectric layer from hydrogen ions and electrons to reduce degradation of ferroelectric performance.

11. A method for manufacturing a ferroelectric capacitor comprising the steps of:

forming a substructure of the capacitor having a contact plug passing therethrough for electrically connecting a bottom electrode: of the capacitor to an underlying active layer;

depositing over the substructure the bottom electrode including a barrier layer intermediate therebetween having a composition including Iridium;

depositing over the bottom electrode a ferroelectric layer such that the diffusion of oxygen from the ferroelectric layer to the contact plug is inhibited by the intermediate barrier layer;

depositing over the ferroelectric layer a top electrode;

depositing over the top electrode, the underlying ferroelectric layer and the bottom electrode a first hardmask;

etching to pattern the top electrode using the first hardmask;

depositing over the remaining portions of the first hardmask and on the bottom electrode an additional hardmask comprised of $Al_2O_3$; and sputter etching to pattern the bottom electrode and the barrier layer such that the sputter effect removes substantially all fences from sidewalls of the additional hardmask.

12. A device comprising:

a barrier layer for blocking the diffusion of contaminants from an intermediate layer; and a hardmask having an etching selectivity relative to the barrier layer at least five times the etching selectivity of Ir relative to TEOS, the hardmask protecting the intermediate layer while etching the barrier layer, wherein the barrier layer has a thickness of greater than 200 nm.

13. The device of claim 12, wherein the material composing the barrier layer includes Ir and the material composing the hardmask includes $Al_2O_3$.

14. The device of claim 12, wherein the material composing the barrier layer includes $IrO_2$ and the material composing the hardmask includes $Al_2O_3$.

15. The device of claim 12, wherein the contaminants include oxygen.

16. The device of claim 12, wherein the intermediate layer includes a top electrode, bottom electrode and ferroelectric layer between the top electrode and bottom electrode to form a ferroelectric capacitor.

17. The device of claim 16, further comprising a contact plug for electrically connecting the bottom electrode to an active region and wherein the barrier layer reduces the amount of oxygen diffusing from the ferroelectric layer to the contact plug.

18. An FeRAM cell using the ferroelectric capacitor of claim 16 for storing data.

19. The device of claim 16, wherein the hardmask seals the capacitor to protect the ferroelectric layer from hydrogen ions and electrons to reduce degradation of ferroelectric performance.

* * * * *

UNITED STATES PATENT AND TRADEMARK OFFICE
CERTIFICATE OF CORRECTION

PATENT NO. : 7,045,837 B2  
APPLICATION NO. : 10/356314  
DATED : May 16, 2006  
INVENTOR(S) : Ulrich Egger et al.

Page 1 of 1

It is certified that error appears in the above-identified patent and that said Letters Patent is hereby corrected as shown below:

Column 2, line 47, "fop" should read --top--.

Column 3, lines 47-62 should be one paragraph.

Column 5, line 51, after "electrode", delete ":".

Signed and Sealed this

Nineteenth Day of September, 2006

JON W. DUDAS  
*Director of the United States Patent and Trademark Office*